United States Patent
Zhu et al.

(10) Patent No.: US 9,324,768 B1
(45) Date of Patent: Apr. 26, 2016

(54) SYSTEM AND METHOD OF SHARED BIT LINE MRAM

(71) Applicant: QUALCOMM Incorporated, San Diego, CA (US)

(72) Inventors: Xiaochun Zhu, San Diego, CA (US); Xia Li, San Diego, CA (US); Seung Hyuk Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/559,528

(22) Filed: Dec. 3, 2014

(51) Int. Cl.
| | |
|---|---|
| *G11C 11/00* | (2006.01) |
| *H01L 27/22* | (2006.01) |
| *G11C 11/16* | (2006.01) |
| *H01L 43/02* | (2006.01) |
| *H01L 43/08* | (2006.01) |

(52) U.S. Cl.
CPC ............ *H01L 27/226* (2013.01); *G11C 11/161* (2013.01); *G11C 11/1659* (2013.01); *H01L 43/02* (2013.01); *H01L 43/08* (2013.01)

(58) Field of Classification Search
CPC ............ G11C 13/004; G11C 11/5678; G11C 13/0004; G11C 13/0033; G11C 16/3431; G11C 11/16; G11C 11/1673; G11C 11/1675; G11C 2213/77; G11C 2213/79; G11C 5/025

USPC .......... 365/148, 163, 222, 158, 171, 189.011, 365/189.07, 189.15, 189.16, 194, 225.5, 365/243.5
See application file for complete search history.

(56) References Cited

U.S. PATENT DOCUMENTS

| | | | |
|---|---|---|---|
| 7,092,279 B1 | 8/2006 | Sheppard | |
| 8,213,216 B2 | 7/2012 | Wang et al. | |
| 8,743,595 B2 | 6/2014 | Kitano | |
| 2009/0161422 A1* | 6/2009 | Zhu ..................... | G11C 11/16 365/171 |
| 2014/0098590 A1 | 4/2014 | Lee et al. | |

OTHER PUBLICATIONS

Zhao W., et al., "High Density Spin-Transfer Torque (STT)-MRAM Based on Cross-Point Architecture," 4th IEEE International Memory Workshop (IMW), 2012, pp. 1-4.

* cited by examiner

*Primary Examiner* — Thong Q Le
(74) *Attorney, Agent, or Firm* — Muncy, Geissler, Olds & Lowe, P.C.

(57) ABSTRACT

An STT magnetic memory includes adjacent columns of STT magnetic memory elements having a top electrode and a bottom electrode. A shared bit line is coupled to the top electrode of the STT magnetic memory elements in at least two of the adjacent columns. The bottom electrodes of the STT magnetic memory elements of one of the adjacent columns are selectively coupled to one source line, and the bottom electrodes of the STT magnetic memory elements of another among the adjacent columns are selectively coupled to another source line.

30 Claims, 7 Drawing Sheets

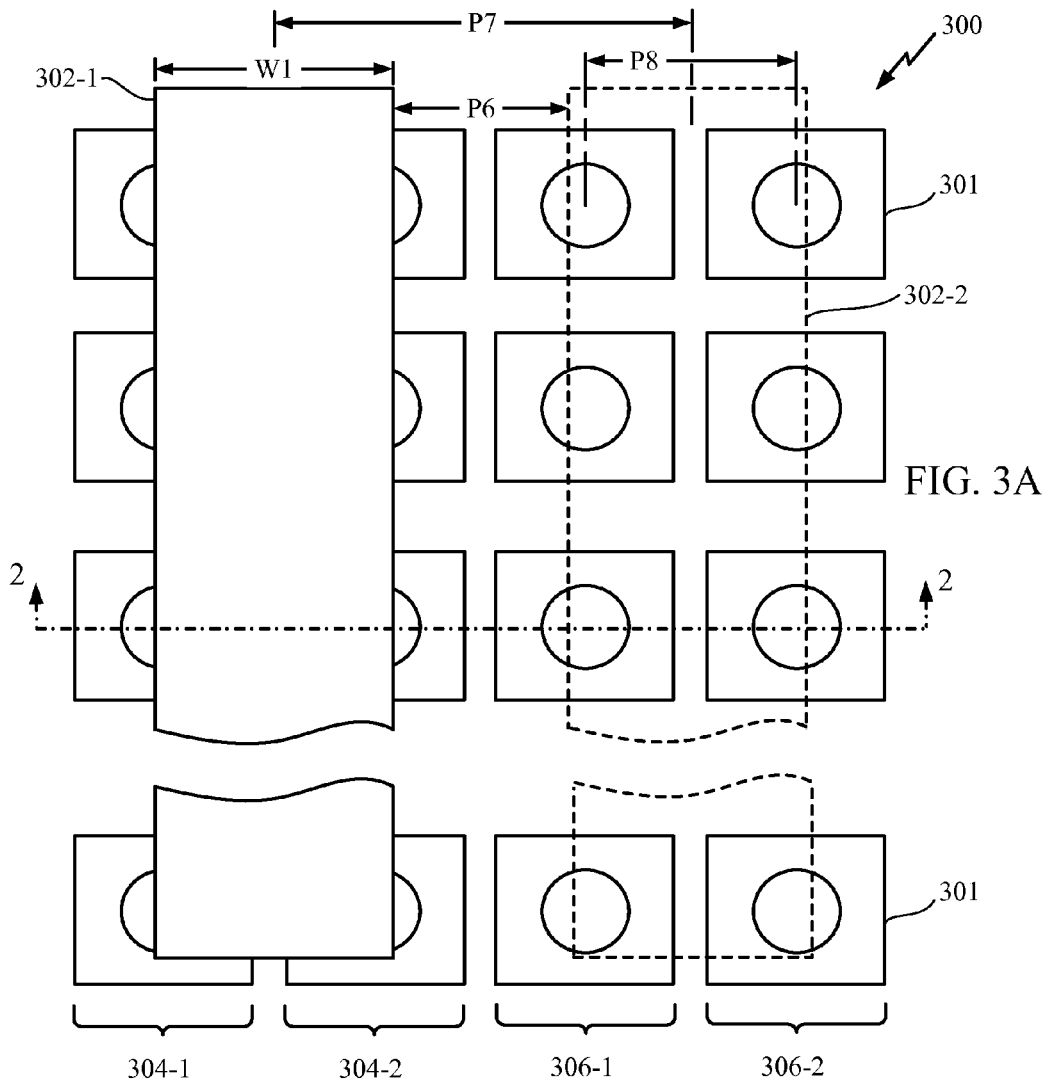
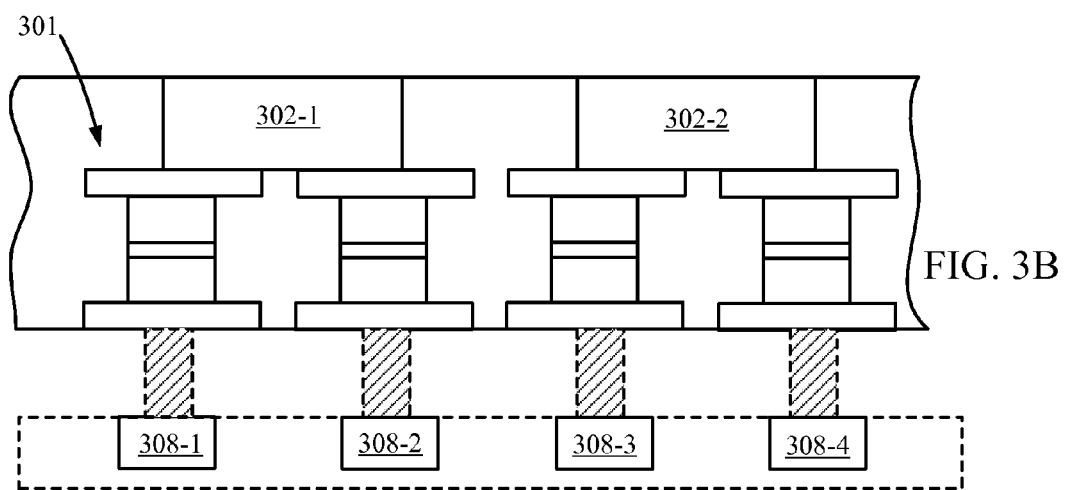

| | W0 | W1 | RD |
|---|---|---|---|
| BL<0> | H | L | L |
| BL<2> | L | L | L |
| SL<0> | L | H | H |
| SL<1> | H | L | L |
| SL<2> | L | L | L |
| WL<0> | H | H | H |
| WL<1> | L | L | L |

SYSTEM AND METHOD OF SHARED BIT LINE MRAM

FIELD OF DISCLOSURE

The technical field of the disclosure relates to magneto-resistive memory and more specifically, to read and write access to magneto-resistive memory elements within random access memory (RAM) arrays.

BACKGROUND

Magneto-resistive memory (hereinafter "magnetic memory") is considered a promising technology for next generation non-volatile memory. Potential features include, but are not limited to, fast switching, high switching cycle endurance, low power consumption, and extended unpowered archival storage.

The spin-transfer torque (STT) magnetic memory is one known technology for magnetic memory. The STT magnetic memory generally has an addressable array of STT bitcells, each STT bitcell having an STT magnetic memory element that includes a "free" magnetization layer that is switchable between two stable, mutually opposite magnetization states. One of the two states is an alignment parallel (P state) to a magnetization of a fixed layer, and the other is opposite, or anti-parallel (AP state), to the fixed magnetic layer. The electrical resistance of the STT magnetic memory element is lower in the P state than in the AP state, which enables reading that state. STT bitcells can be arranged in a row-column array, with address decoding and access circuitry, to form STT random access memory (STT-MRAM).

Factors considered in STT-MRAM design include thermal budget, as well as a preference, in various applications, for compatibility with certain known techniques and conventions used in designing and processing integrated circuit (IC) chips. One example design convention that is known in the IC arts is "back end of processing" or "BEOL."

SUMMARY

The following summary touches on certain examples in accordance with one or more aspects. The summary is not a defining overview of all exemplary or contemplated aspects. The summary is not intended to prioritize or even identify key elements of all aspects, and is not intended to limit the scope of any aspect.

One example of one disclosed STT magnetic memory can include a plurality of columns of STT magnetic memory elements, the STT magnetic memory elements respectively comprising a top electrode and a bottom electrode, and can include a plurality of shared bit lines overlaying the plurality of columns of STT magnetic memory elements. In an aspect, at least one of the shared bit lines can be coupled to the top electrode of the STT magnetic memory elements of a group of at least two of the columns of STT magnetic memory elements. In a further aspect, a plurality of source lines may be included, one or more of which can be switchably coupled to the bottom electrode of the STT magnetic memory element of a corresponding one of the columns of STT magnetic memory elements.

One example of one disclosed method can provide individual access of an STT magnetic memory element among a plurality of STT magnetic memory elements coupled to a shared bit line. One example can include concurrently coupling, to an access voltage, a top electrode of a plurality of STT magnetic memories in a first column of STT magnetic memory elements and the top electrode of a plurality of STT magnetic memories in a second column of STT magnetic memory elements. One example can also include, in an aspect, selectively coupling, to a complementary access voltage, a bottom electrode of a selected STT magnetic memory in the first column of STT magnetic memory elements and a bottom electrode of a selected STT magnetic memory in the second column of STT magnetic memory elements.

One example of one disclosed method can also include, in an aspect, applying the first access voltage to a shared bit line concurrently coupled to the top electrodes of the plurality of STT magnetic memories in the first column of STT magnetic memory elements and the top electrodes of the plurality of STT magnetic memories in the second column of STT magnetic memory elements.

One example of one disclosed apparatus can provide for individually accessing a STT magnetic memory element among at least two adjacent columns of STT magnetic memory elements. In an aspect, the apparatus can include means for concurrently coupling, to an access voltage, a top electrode of a plurality of STT magnetic memory elements in a first column of the at least two adjacent columns of STT magnetic memory elements and a second column of the at least two adjacent columns of STT magnetic memory elements. In a further aspect, the apparatus can also include means for selectively coupling, to a complementary access voltage, a bottom electrode of a selected STT magnetic memory element in the first column of the at least two adjacent columns of STT magnetic memory elements and a bottom electrode of a selected STT magnetic memory element in the second column of the at least two adjacent columns of STT magnetic memory elements.

One example of one of the disclosed STT magnetic memories can include a group of at least R adjacent columns of STT magnetic memory elements and a shared bit line, and the shared bit line may be coupled to the group of at least R adjacent columns of STT magnetic memory elements. In an aspect, the example STT magnetic memory can also include a first source line, coupled through a first plurality of selectively enabled switch transistors, to a respective first plurality of STT magnetic memory elements in a first column among the group of at least at least R adjacent columns of STT magnetic memory elements. In a further aspect, the example STT magnetic memory can also include a second source line, coupled through a second plurality of selectively enabled switch transistors, to a respective second plurality of STT magnetic memory elements in a second column among the group of at least at least R adjacent columns of STT magnetic memory elements.

BRIEF DESCRIPTION OF THE DRAWINGS

The accompanying drawings found in the attachments are presented to aid in the description of aspects of the invention and are provided solely for illustration of examples according to such aspects and not limitations thereof.

FIG. 3A shows a top projection view of a representative portion of one example shared bit line/compressed pitch MRAM array, sharing two columns per bit line.

FIG. 3B shows a cross-section view of the FIG. 3A shared bit line/compressed pitch STT MRAM array, seen from the FIG. 3A cut projection 2-2.

DETAILED DESCRIPTION

Figure 1:
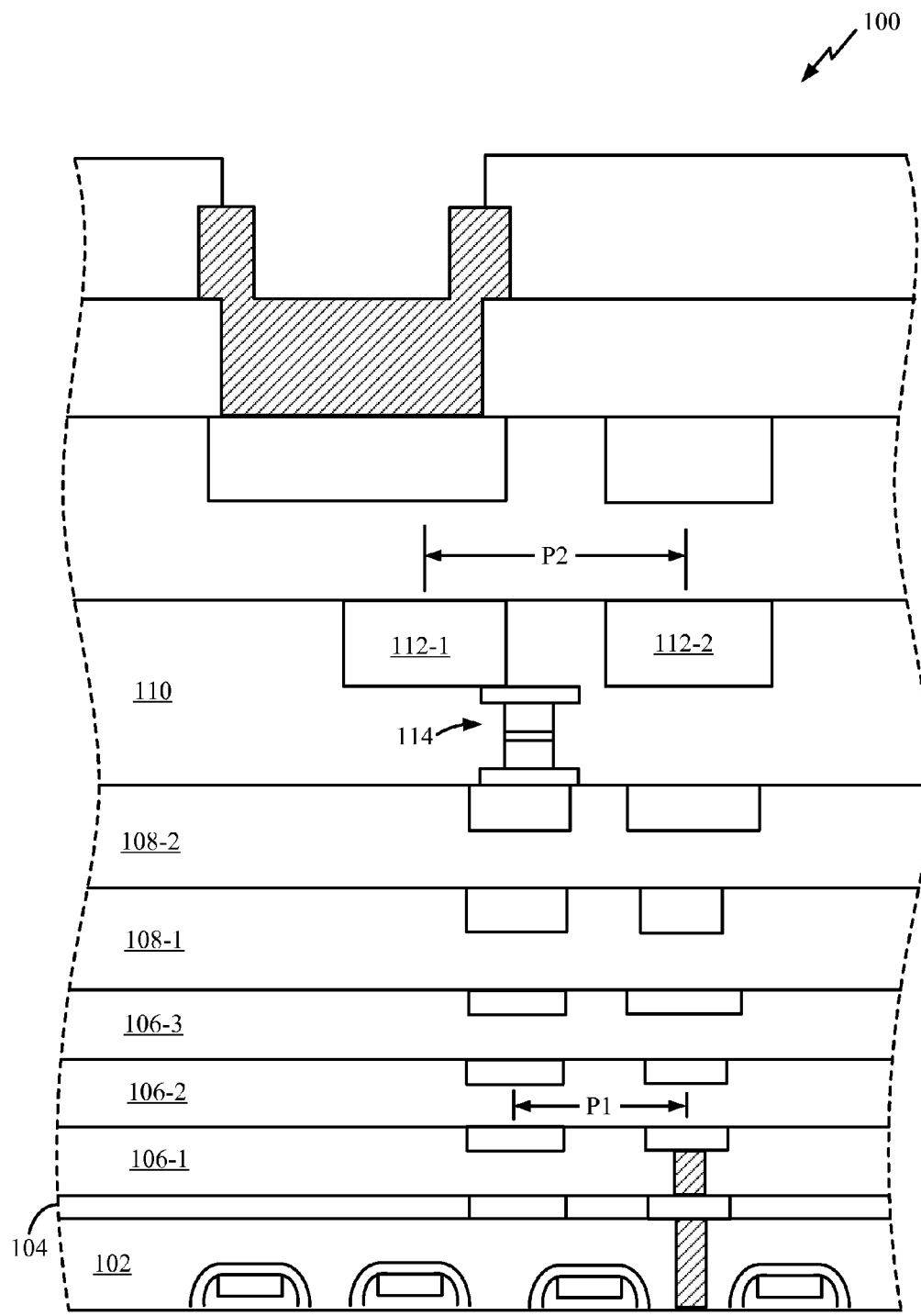
FIG. 1 shows a cross-sectional view of one STT magnetic memory element, arranged in a multi-layer integrated circuit (IC) structure illustrative of example conventional BEOL techniques.

Aspects of the invention and illustrative implementations, applications and operations are set forth in the following description with its appended drawings. The illustrative implementations, applications and operations are not intended to limit the scope of the invention. They are intended to assist persons of ordinary skill in understanding the various concepts sufficiently to practice in accordance with the same. Alternate implementations and applications may be become apparent to persons of ordinary skill upon reading this disclosure devised without departing from its scope.

The word "exemplary" is used herein to mean "serving as an example, instance, or illustration." Any aspect or feature thereof that is described herein as "exemplary" is not necessarily to be construed as preferred or advantageous over other aspect or feature. Likewise, description of features, advantages, or modes of operation in association with phases such as "in an aspect" and "aspect of the invention" do not imply that all aspects, applications and practices of the invention must include the discussed feature, advantage or mode of operation.

Names, labels and various terminology used herein is purposes consistent reference to described examples, and is not intended to limit the scope of the invention. As used herein, the singular forms "a", "an" and "the" are intended to include the plural forms as well, unless the context clearly indicates otherwise. It will be understood that the terms "comprises", "comprising," "includes" and/or "including", when used herein, specify the presence of stated features, integers, steps, operations, elements, and/or components, but do not preclude the presence or addition of one or more other features, integers, steps, operations, elements, components, and/or groups thereof.

Example methods, applications, implementations and operations are described in terms of sequences of actions to be performed or controlled by, for example, elements of a computing device. It will be recognized upon reading this disclosure that various actions described herein can be performed by specific circuits (e.g., application specific integrated circuits (ASICs)), by program instructions being executed by one or more processors, or by a combination of both. Additionally, sequence of actions described herein can be considered to be implemented entirely within any form of computer readable storage medium having stored therein a corresponding set of computer instructions that upon execution would cause an associated processor to perform the functionality described herein. Also, example implementations that may employ a computing device and program instructions, or specific circuits, or both, may be described herein as, for example, "logic configured to" perform the described actions. Thus, the various aspects of the invention may be implemented in a number of different forms, all of which have been contemplated to be within the scope of the claimed subject matter.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields, electron spins particles, electrospins, or any combination thereof.

Further, those of skill in the art will appreciate that the various illustrative logical blocks, modules, circuits, and algorithm steps described herein may be implemented as electronic hardware, computer software, or combinations of both. In accordance with the interchangeability of hardware and software for implementing aspects, various illustrative components, blocks, modules, circuits, and steps are described generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

It will be understood that the order in which functions, operations, steps and/or actions are described as being performed, and the order in which functions, operations, steps and/or actions are set forth within any of the claims is not intended to, and does not necessarily limit the scope of the invention to functions, operations, steps and/or actions practices in that order.

FIG. 1 is a cross-sectional view of a multi-layer integrated circuit (ML-IC) structure 100, configured in a manner representative of certain conventional BEOL techniques, having an STT magnetic memory element, in one example conventional BEOL-compatible arrangement. It will be understood that FIG. 1 shows a simplified view of the ML-IC structure 100, and omits various details that are known to persons of ordinary skill in the art and not relevant to an understanding of disclosed concepts.

Referring to FIG. 1, the ML-IC structure 100 includes a lower layer 102 having field-effect transistors (shown in FIG. 1 but not separately numbered), which may perform operations, for example, of addressing or access control. Such operations, in the ML-IC structure 100, are not relevant to an understanding of concepts, and are known to persons of ordinary skill in the art and, therefore, further detailed description is omitted. The lower layer 102 can include contacts, such as the example contact (visible in FIG. 1 but not separately numbered) to the first metal layer 104. The first metal layer 104 can include traces such as the examples that are visible in FIG. 1 (not separately numbered).

Above the first metal layer may be one, or a stacking of two or more second-level metal layers, such as the example first second-level metal layer 106-1, overlaid by the example second second-level metal layer 106-2 and third second-level metal layer 106-3. Each of the first second-level metal layer 106-1, second second-level metal layer 106-2 and third second-level metal layer 106-3 (collectively referred to, for purposes of description, as "second level metal layers" 106) can have respective wire traces (visible in FIG. 1, but not separately numbered). Adjacent wire traces in the second level metal layers 106 can have a minimal pitch P1 between adjacent wiring traces (visible in FIG. 1 but not separately numbered) in the second second-level metal layer 106-2. Vias may be formed in the second-level metal layers 106, such as the example via (visible in FIG. 1 but not separately numbered) shown in the first second-level metal layer 106-1. As will be understood by a person of ordinary skill in the art, various other vias (not visible in FIG. 1) may be included in the second-level metal layers 106, but are omitted to avoid unnecessary details not pertinent to an understanding of concepts.

Continuing to refer to FIG. 1, above the second-level metal layers 106 may be one, or a stacking of two or more third-level metal layers, such as the example first third-level metal layer 108-1, overlaid by the example second third-level metal layer 108-2. Structure of the first third-level metal layer 108-1 and the second third-level metal layer 108-2 (collectively referred to as "third-level metal layers" 108) may be comparable to the structure of the second-level metal layers 106 and, therefore, further detailed description is omitted.

The ML-IC structure 100 can include, over the third-level metal layers 108, what may be termed an "STT magnetic memory element" layer 110. The STT magnetic memory element layer 110 may include a fourth-level metal layer (visible, but not separately numbed) having, for example, fourth level metal traces 112-1 and 112-2. One STT magnetic memory element 114 is shown, having a top electrode (visible in FIG. 1 but not separately labeled) abutting and coupled to the fourth-level metal trace 112-1 and a bottom electrode (visible in FIG. 1 but not separately labeled) abutting and coupled to a metal trace (visible in FIG. 1 but not separately labeled) in the second third-level metal layer 108-2.

Referring to FIG. 1, adjacent metal traces in the fourth-level metal layer, such as the fourth level metal traces 112-1 and 112-2, can have a minimal pitch P2. As can be seen, the pitch P2 is substantially larger than the pitch P1. This is exemplary of typical BEOL design, which includes the pitch in higher level metal layers being larger than lower level metal layers.

Continuing to refer to FIG. 1, the STT magnetic memory element layer (i.e., the layer having the STT magnetic memory element 114), being at a higher level metal layer (e.g., the fourth level metal layer) is exemplary of conventional techniques for BEOL compatible STT-MRAMs. Thermal budget, for example, during processing is among the reasons. For example, if the STT magnetic memory element 114 were positioned in the second-level metal layers 106, that STT magnetic memory element may experience heating from a significantly higher number of processing steps. Such heating can reach and exceed, for example, approximately 400 degrees C. Unwanted effects may occur, such as a decrease in the magnetic resistance ratio (MR) of STT MTJ element 114, and/or an increase in its switching current, each having potentially negative impact on MTJ performance.

Figure 2A:
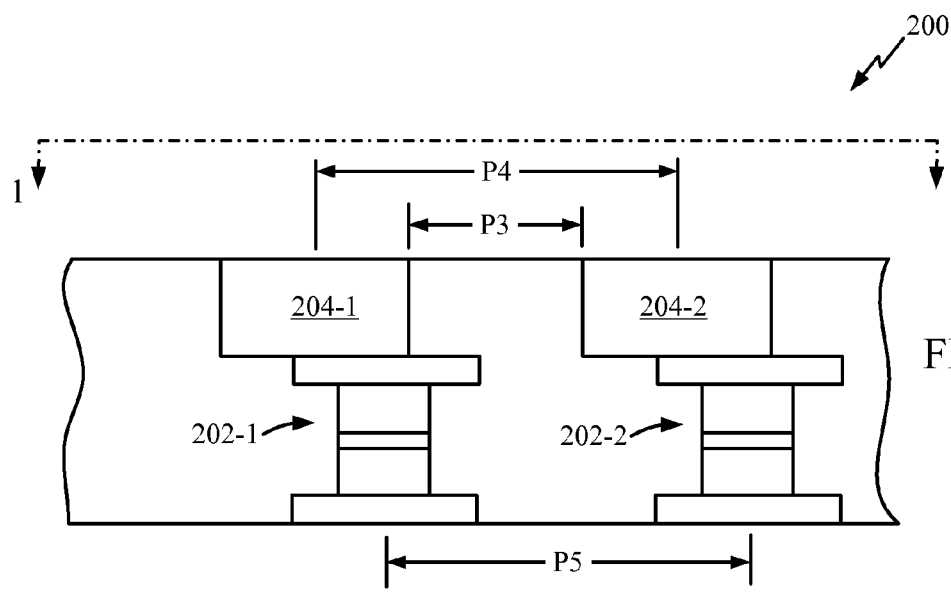
FIG. 2A shows a cross-sectional view, showing two adjacent STT magnetic memory elements of respective adjacent columns of STT magnetic memory elements, arranged in an upper metallization layer of an IC structure, illustrating a conventional technique for meeting thermal budget and having compatibility with known BEOL techniques.

FIG. 2A is a cross-sectional view, showing an upper layer STT-MRAM structure 200, having two adjacent STT magnetic memory elements, 202-1 and 202-2, of respective adjacent columns of STT magnetic memory elements (not fully visible in FIG. 2A). Exemplary of conventional STT-MRAM techniques compatible with conventional BEOL processes, the STT magnetic memory element 202-1 is aligned with a bit line 204-1 and the STT magnetic memory element 202-2 is aligned with a bit line 204-2. The bit lines 204-1 and 204-2 are spaced by a spacing P3, where P3 may be in accordance with conventional BEOL processes. The bit lines 204-1 and 204-2 may have a minimum width (visible but separately labeled on FIG. 2A) which, combined with the spacing P3, can set a minimum center-to-center pitch (hereinafter "minimum pitch") P4 between the adjacent bit lines 204-1 and 204-2. The minimum pitch P4, in turn, places a limit on the minimum center-to-center column pitch (hereinafter "minimum column pitch") P5 between the adjacent column STT magnetic memory elements 202-1 and 202-2.

Figure 2B:
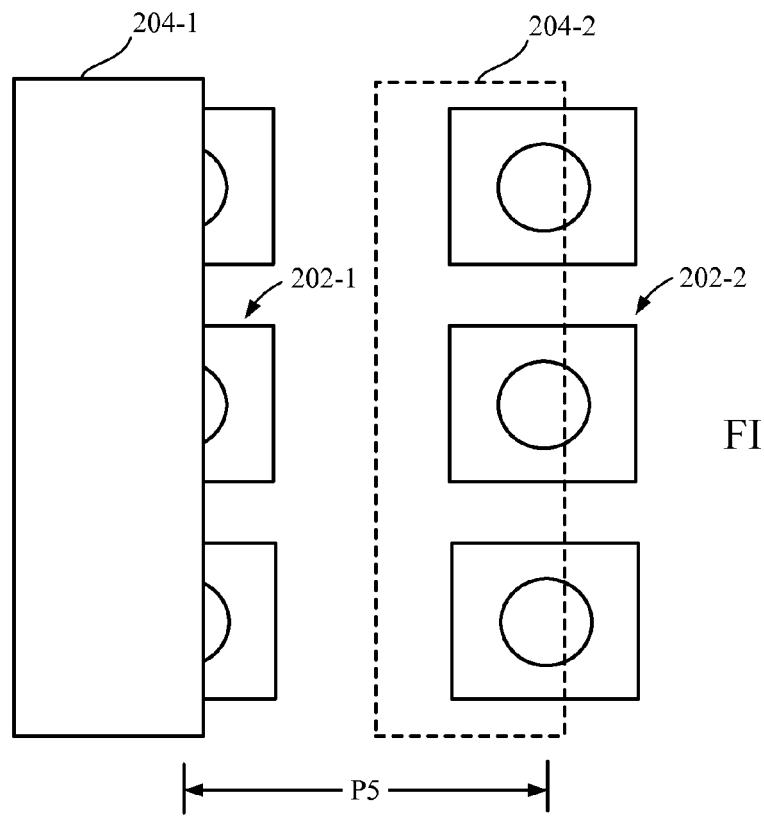
FIG. 2B shows a top projection view of the FIG. 2A structure, showing portions of the two adjacent shown in part FIG. 2A.

FIG. 2B is a top projection view of the STT-MRAM structure 200, from the FIG. 2A projection 1-1. Referring to FIG. 2B, it can be further seen that the minimum pitch P4 can place, effectively, a hard limit on the minimum column pitch P5 between the adjacent columns (visible but not separately numbered) of STT magnetic memory elements in which the example STT magnetic memory elements 202-1 and 202-2 are situated.

Aspects can provide a row-column array of STT magnetic memory elements, with an overlaying plurality of bit lines, having adjacent columns of STT magnetic memory elements spaced, center-to-center, closer than the center-to-center pitch of the overlaying plurality of bit lines. For purposes of description, general arrangements and configurations implementing the disclosed concepts can be referred to as "shared bit line/compressed pitch STT MRAM arrays. Also, for brevity, the phrase "shared bit line/compressed pitch STT MRAM array" will be alternatively referenced by the following arbitrarily selected abbreviation: "SBC/STT MRAM array." It will be understood that "shared bit line/compressed pitch STT MRAM array" and its abbreviated form SBC/STT MRAM array are arbitrarily selected names, used herein only for purposes of convenience in description, and do not have any inherent meaning or import any meaning into this disclosure. Stated differently, replacing every instance of "shared bit line/compressed pitch STT MRAM array" and "SBC/STT MRAM array" that appears in this disclosure with another arbitrarily selected name, e.g., "Array X," will result in no change in the description set forth by this disclosure.

In an aspect an STT magnetic memory may include a plurality of columns of STT magnetic memory elements, and the STT magnetic memory elements may comprise a top electrode and a bottom electrode. In an aspect, an STT magnetic memory can include a plurality of shared bit lines, overlaying the plurality of columns of STT magnetic memory elements, wherein at least one of the shared bit lines may be coupled to the top electrode of the STT magnetic memory elements of a group of at least two of the columns of STT magnetic memory elements. In an aspect, a plurality of source lines may be provided, and each of the source lines may be switchably coupled, for example, through selectively enabled switch transistors, to the bottom electrode of the STT magnetic memory element of a corresponding one of the columns of STT magnetic memory elements.

FIG. 3A shows a top projection view of an illustrative portion of an SBC/STT MRAM array 300 of STT magnetic memory elements 301, which may be arranged as M rows by N columns. Referring to FIG. 3A, the SBC/STT MRAM array 300 can include a first shared bit line 302-1 that is adjacent a second shared bit line 302-2. Each of the shared bit line 302-1 and shared bit line 302-2 (collectively referred to as "shared bit lines" 302) can comprise a metal conductor. It will be understood that the first shared bit line 302-1 and the second shared bit line 302-2 may be a representative of, for example, any two adjacent shared bit lines among a larger set, e.g., N/2, of shared bit lines. It will be understood that the first shared bit line 302-1 and the second shared bit line 302-2 may be formed in an upper metallization layer (not fully visible in FIG. 3A) of a BEOL compatible IC chip (not visible in its entirety in FIG. 3A). For example, referring to FIG. 1, the shared bit lines 302 may be formed in the fourth-level metal layer.

Referring to FIG. 3A, in an aspect, the first shared bit line 302-1 can extend parallel to and overlay, or at least partially overlay, a first pair of STT magnetic memory element columns, comprising a first pair first STT column 304-1 and first pair second STT column 304-2. Similarly, the first shared bit line 302-2 can extend parallel to and overlay or at least partially overlay a second pair of STT magnetic memory element columns, comprising a second pair first STT column 304-3 and second pair second STT column 304-4. It will be understood that "first pair" and "second pair" are only labels for reference to the figures. For example, the "first pair first STT column" 304-1 may be middle column among 64, 256 or any other quantity of columns (not visible in FIG. 3A). FIG. 3A shows four example STT magnetic memory elements (visible but not separately numbered) are shown for each of first pair first STT column 304-1 and first pair second STT column 304-2.

FIG. 3B shows a cross-sectional view of the FIG. 3A SBC/STT MRAM array, seen from the FIG. 3A cut projection 2-2. In an aspect, each of the STT magnetic memory elements (a representative one being labeled 301) can be a vertically formed, i.e., a pillar, having an upper electrode (shown but not separately labeled) coupled to its corresponding shared bit line. In an aspect a source line can be provided for each of the columns of STT magnetic memory elements. For example, a first source line 308-1 can be provided for the first pair first STT column 304-1, a second source line 308-2 can be provided for the first pair second STT column 304-2, a third source line 308-3 can be provided for the second pair first STT column 306-1, and a fourth source line 308-4 can be provided for the second pair second STT column 306-2. For each of the source lines, a via (visible in FIG. 3B but not separately labeled) can connect that source line to a bottom electrode (visible in FIG. 3B but not separately numbered) of all the STT magnetic memory elements in its corresponding STT column.

In an aspect, examples of which are described in further detail later in this disclosure, each of the first source line 308-1, second source line 308-2, third source line 308-3 and fourth source line 308-4 (collectively "source lines" 308) may be switchably coupled to the bottom electrode of the STT magnetic memory element of a corresponding one of the columns of STT magnetic memory elements.

For convenience in describing example features, the first pair first STT column 304-1 and the first pair second STT column 304-2 may be alternatively referred to as a "first group of STT columns" 304, and the second pair first STT column 306-1 and the second pair second STT column 306-2 may be alternatively referred to as a "second group of STT columns" 306. Each of the first group of STT columns 304 and the second group of STT columns 306 includes at least two columns of STT magnetic memory elements. Accordingly, referring to FIG. 3B, the first shared bit line 302-1 of the plurality of shared bit lines is coupled to the top electrode of the STT magnetic memory elements of the first group of STT columns 304, and the second shared bit line 302-2 of the plurality of shared bit lines is coupled to the top electrode of the STT magnetic memory elements of the second group of STT columns 306.

Further to the above-described example first group of STT columns 304 and second group of STT columns 306, in an aspect, the N columns of STT magnetic memory elements may be "grouped" as N/R groups of adjacent columns, where N is the total quantity of columns and R is an integer greater than one. In an aspect, R may be selected to divide evenly into N, such that each of the N/R groups of adjacent columns may comprise at least R adjacent columns of STT magnetic memory elements. In a further aspect, each of the N/R groups of adjacent columns may be provided a corresponding shared bit line. The N/R shared bit lines may extend in a metal layer above the array of STT magnetic memory elements, each shared by a respective group of adjacent columns of STT magnetic memory elements. In an aspect, each shared bit line may couple to the top electrode of each STT magnetic memory element in its corresponding group of adjacent columns. The top electrodes may be referred to as a "first read/write current terminal."

In an aspect, the SBC/STT MRAM array may include N source lines, one for each of the N columns of STT magnetic memory elements. The N source lines may extend, for example, under the array of STT magnetic memory elements. In an aspect, each shared bit line may couple, for example through a switch transistor (not visible in FIGS. 3A-3B) to bottom electrode of each STT magnetic memory element in its corresponding column of STT magnetic memory elements. The bottom electrode may be termed as "second read/write current terminal."

In a further aspect, examples of the SBC/STT MRAM array may include a shared bit line access circuitry (not visible in FIGS. 3A-3B). In an aspect, the shared bit line access circuitry may be configured to perform column-specific access by selectively enabling the N/R shared bit lines, and the N source lines. One example access operation according this aspect can access an arbitrary "jth" column by enabling the shared bit line among the N/R shared bit lines to which the jth column is connected, in conjunction with enabling the source line, among the N source lines, to which the jth column is connected.

In an aspect, structures and methods according to this disclosure may perform row access using, for example, known conventional techniques for row access of conventional row-column array MRAMs. Further detailed description of row access techniques is therefore omitted except where incidental to other description.

Further to one aspect, R may be selected as two. It will be understood that two is only one example value for R, and is not intended to limit the scope of structures and methods that may practice according to this disclosure. To avoid obfuscation of concepts with description of unnecessary details, examples will assume that the numerical value of "N" is an even number. That is not intended to limit the scope of structures and methods that may practice according to this disclosure. On the contrary, upon reading this disclosure, a person of ordinary skill in the art can readily modify, without undue experimentation, described examples to accommodate a non-even N.

In one example in which R is two, N/2 shared bit lines may be arranged in a overlaying the STT magnetic memory element layer having M rows and N columns. In an aspect, the N/2 shared bit lines may have a shared bit line pitch, and depending on the geometry of the STT magnetic memory elements, adjacent columns of the STT magnetic memory elements may have a center-to-center column spacing that can be approximately one-half of the bit line pitch. In one example in which R is two, each of the N/2 shared bit lines may have a width that is greater than the width of the STT-magnetic memory elements. In a further example in which R is two, each of the N/2 shared bit lines may extend in an alignment above a midpoint line between a corresponding two columns of STT magnetic memory elements. In a related example in which R is two, each of the N/2 shared bit lines may have a width that can extend, for example, symmetrical to the midpoint line to overlay, or partially overlay, each of the columns of STT magnetic memory elements in the corresponding pair of STT magnetic memory elements. Stated differently, each of the N/2 shared bit lines may at least partially overlay at least two adjacent columns of STT magnetic memory elements. Benefits of sharing bit lines can include, without limitation increase in MTJ array density, reduction in parasitic resistance of bit lines, and improvement in magnetic resistance ratio MR and reduction in switching current. Additional benefits can include, for example, use for complementary bitcells for differential high speed sensing for high performance circuits.

Referring to FIG. 3A, the SBC/STT MRAM, the first shared bit line 302-1 and the second shared bit line 302-2 have a spacing P6. In an aspect, the spacing P6 may be, for example, a minimum for the upper metallization layer in which the first shared bit line 302-1 and second shared bit line 302-2 are formed. The first shared bit line 302-1 may have a width W1. The second shared bit line 302-2 may have the same width W1 (not separately labeled on FIG. 3A). It may be assumed that all of the remaining N/2 shared bit lines (not visible in FIG. 3A) may have the same width W1. In one alternative, some of the N/2 shared bit lines may have mutually different widths. The first shared bit line 302-1 and second shared bit line 302-2 may have a center-to-center pitch P7.

Referring the FIG. 3A, the first shared bit line 302-1 overlays the first group of STT magnetic memory element columns 304, comprising a first pair first STT column 304-1 and first pair second STT column 304-2.

Referring to FIG. 3A, the first pair first STT column 304-1 may be spaced by a center-to-center pitch P8 from the first pair second STT column 304-2. The center-to-center pitch P8, as seen in the FIG. 3A example, can be approximately one-half the center-to-center pitch between the first shared bit line 302-1 and the second shared bit line 302-2. It will be appreciated that this feature can provide a solution to the limitation on STT magnetic memory element column spacing that may be imposed by conventional techniques for STT magnetic memory elements in BEOL processes.

Figure 4A:
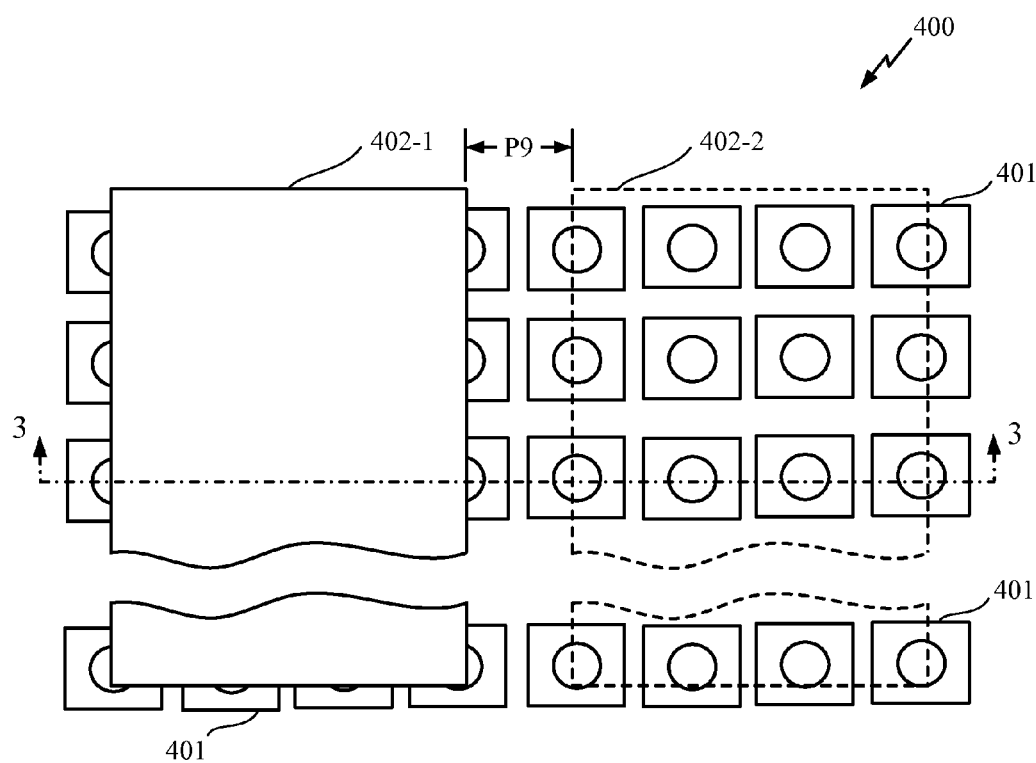
FIG. 4A shows a top projection view of a representative portion of one example shared bit line/compressed pitch STT MRAM array, sharing four columns per bit line.

Further to one aspect, R may be selected as four. In one example application where R is selected as four, N/4 shared bit lines may be provided. In an aspect, each of the N/4 shared bit lines may at least partially overlay at least four adjacent columns of STT magnetic memory elements. It will be understood that four, like two, is only one example value for R, and is not intended to limit the scope of structures and methods that may practice according to this disclosure. To avoid obfuscation of concepts with description of unnecessary details, it will be assumed that the numerical value of "N" is evenly divisible by four. It will be understood that this is not intended to limit the scope of structures and methods that may practice according to this disclosure. On the contrary, upon reading this disclosure, a person of ordinary skill in the art can readily modify, without undue experimentation, described examples to accommodate values of N that are not evenly divisible by four FIG. 4A shows a top projection view of a representative portion of SBC/STT MRAM array 400 of STT magnetic memory elements 401, sharing four columns per bit line. Referring to FIG. 4A, in an aspect, the SBC/STT MRAM array 400 may include a first four-column share bit line 402-1 above a first group of four adjacent columns (visible but not separately numbered), adjacent to a second four-column share bit line 402-2 above a second group of four adjacent columns (visible but not separately numbered). The first four-column share bit line 402-1 may be separated by a spacing P9 from the second four-column share bit line 402-2. In an example, the spacing P9 may be the minimum spacing provided by the BEOL process (not fully visible in FIG. 4A) for the metal layer (not fully visible in FIG. 4A) in which the first four-column share bit line 402-1 and the second four-column share bit line 402-2 are formed.

Figure 4B:
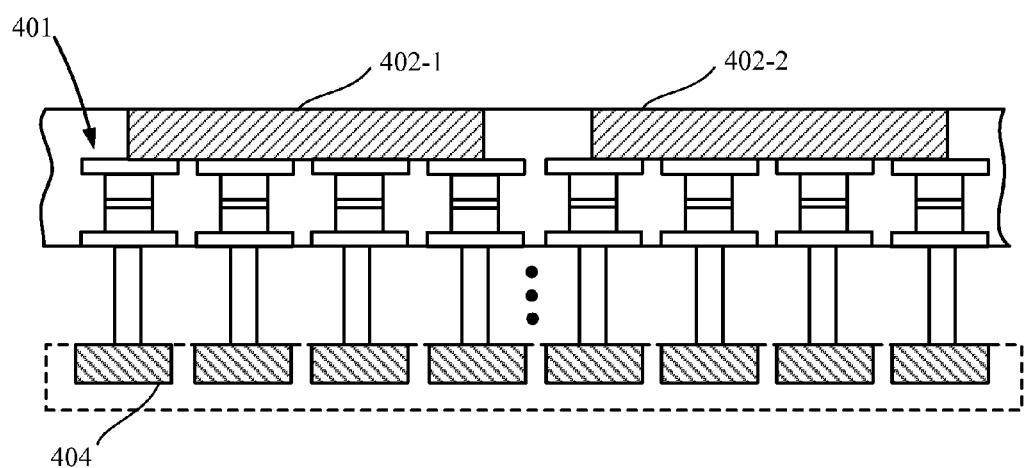
FIG. 4B shows a cross-section view of the FIG. 4A shared bit line/compressed pitch STT MRAM array, seen from the FIG. 4A cut projection 3-3.

FIG. 4B shows a cross-sectional view of the FIG. 4A SBC/STT MRAM array 400, seen from the FIG. 3A cut projection 3-3. Referring to FIG. 4B, in an aspect, the SBC/STT MRAM array 400 may include a source line for each of the columns of STT magnetic memory elements 401, such as the eight example source lines that are visible in FIG. 4B, with one representative example "404."

Referring to FIGS. 3A, 3B, 4A and 4B, various aspects can provide access to STT magnetic memory elements by operations that can include concurrently coupling, to an access voltage, a top electrode of a plurality of STT magnetic memories in a first column of STT magnetic memory elements and the top electrode of a plurality of STT magnetic memories in a second column of STT magnetic memory elements. For example, referring to FIGS. 3A and 3B, applying an access voltage (not explicitly visible in FIGS. 3A and 3B) to the first shared bit line 302-1 concurrently couples, to the access voltage, the top electrode of the STT magnetic memory elements 301 in the first group of STT columns 304. Operations can further include selectively coupling, to a complementary access voltage, a bottom electrode of a selected STT magnetic memory in the first column of STT magnetic memory elements and a bottom electrode of a selected STT magnetic memory in the second column of STT magnetic memory elements. For example, referring to FIGS. 3A and 3B, a complementary access voltage can be applied to a selected one of the source lines 308 and, concurrently, the selected source line can be coupled, through a switch transistor (not explicitly visible in FIGS. 3A and 3B), to the bottom electrode of a selected one of the STT magnetic memory elements 301.

Figures 5, 6:
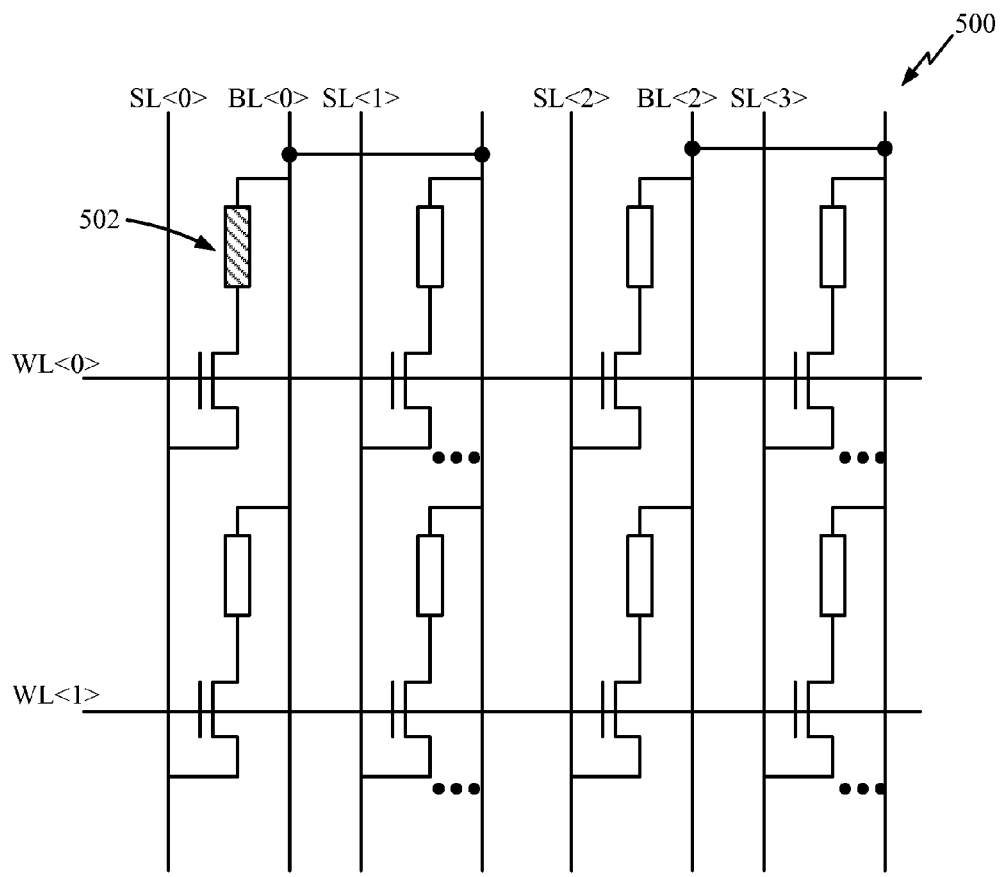
FIG. 5 shows one example current path through one STT magnetic memory element access operations of a shared bit line/compressed pitch STT MRAM array.
FIG. 6 shows a signal state diagram associated with example operations of write and read access of the FIG. 5 STT magnetic memory element.

FIG. 5 shows, by bold line, one access control and current path for accessing a selected STT bitcell in an SBC/STT MRAM array 500. Referring to FIG. 5, shared bit line BL<0> is coupled to a top electrode (visible by schematic symbol, but not separately numbered) of STT magnetic memory element (visible but not separately numbered) of the STT bitcell 502. The shared bit line BL<0> is also coupled to three other STT bitcells (visible in FIG. 3, but not separately numbered). Two of the four STT bitcells that couple to the shared bit line BL<0>, namely the STT bitcell 502 and the STT bit cell immediately below the STT bitcell 502 are in a left column (visible but not separately numbered), and the other two are in a right column (visible but not separately numbered). The STT bitcell 502 and the other STT bit cell in the right column are coupled, through respective word line switches, or access switch transistors (visible in FIG. 5, but not separately numbered), to a first source line SL<0>. The two STT bitcells coupled to bit line BL<0> that are in the right column are coupled, through respective access switch transistors (visible in FIG. 5, but not separately numbered), to a second source line SL<1>.

Referring to FIG. 5, shared bit line BL<2> is coupled to a top electrode (visible by schematic symbol, but not separately numbered) of another four STT bitcells (visible in FIG. 3, but not separately numbered). Two of the four STT bitcells coupled to bit line BL<2> are in another left column and are coupled, through respective access switch transistors (visible in FIG. 5, but not separately numbered), to a third source line SL<2>. The other two of the four STT bitcells coupled to bit line BL<2> are in another right column and are coupled, through respective access switch transistors (visible in FIG. 5, but not separately numbered), to a fourth source line SL<3>.

Continuing to refer to FIG. 5, a first word line WL<0> is coupled to the gate of the access switch transistor of the STT bitcell 502, and to three other of the STT bitcells, i.e., to a row of four STT bitcells. Similarly, a second word line WL<0>, a third word line WL<0> and fourth word line WL<3> are each coupled, respectively, to the gate of the access switch transistors of a row of four of the STT bitcells.

FIG. 6 shows a signal state diagram 600 of the of the shared bit lines, source lines and word lines of the FIG. 5 SBC/STT MRAM array 500, for performing example read and writes of the STT bitcell 502. Referring to FIG. 6, along the top row 602 of the signal state diagram 600 are three operations, which are a WO (write "0"), W1 (write "1") and RD (read). To read the STT bitcell 502, control voltages are applied such that the first shared bit line BL<0> is an enabled shared bit line, the first source line SL<0> is an enabled source line, and a high voltage is placed on the first word line WL<0>. In the present example, operations can therefore include placing a high voltage on the first shared bit line BL<0>, and a low voltage on the first source line SL<0>. The result is a read current (not visible in FIG. 5, passing from the first shared bit line BL<0>, through the STT bitcell 502, and through the first source line SL<0>, for example, to ground. Although the first shared bit line BL<0> applies the high voltage to the other STT bitcells, only the STT bitcell 502 has its access switch transistor in an on state and its source line in a low state, i.e., opposite the voltage ion the first shared bit line BL<0>, both of which must occur for a read.

Referring to FIGS. 5 and 6, to write a "1" to the STT bitcell 502, the first word line WL<0> is high, the first shared bit line BL<0> is low, and the first source line SL<0> high. The first word line WL<0" being "high" means an enabling voltage in the word line switch of the STT bitcell 502. The result is a write current passing from the first source line, through the STT bitcell 502 and to the first shared bit line BL<0>. To write a "0", the relative polarity of the first shared bit line BL<0> and the first source line SL<0> may be reversed. It will be understood that the assignment of logical "0" and logical "1" is arbitrary, so the described relative polarities of the first shared bit line and the first source line SL<0> may be reversed.

Figure 7:
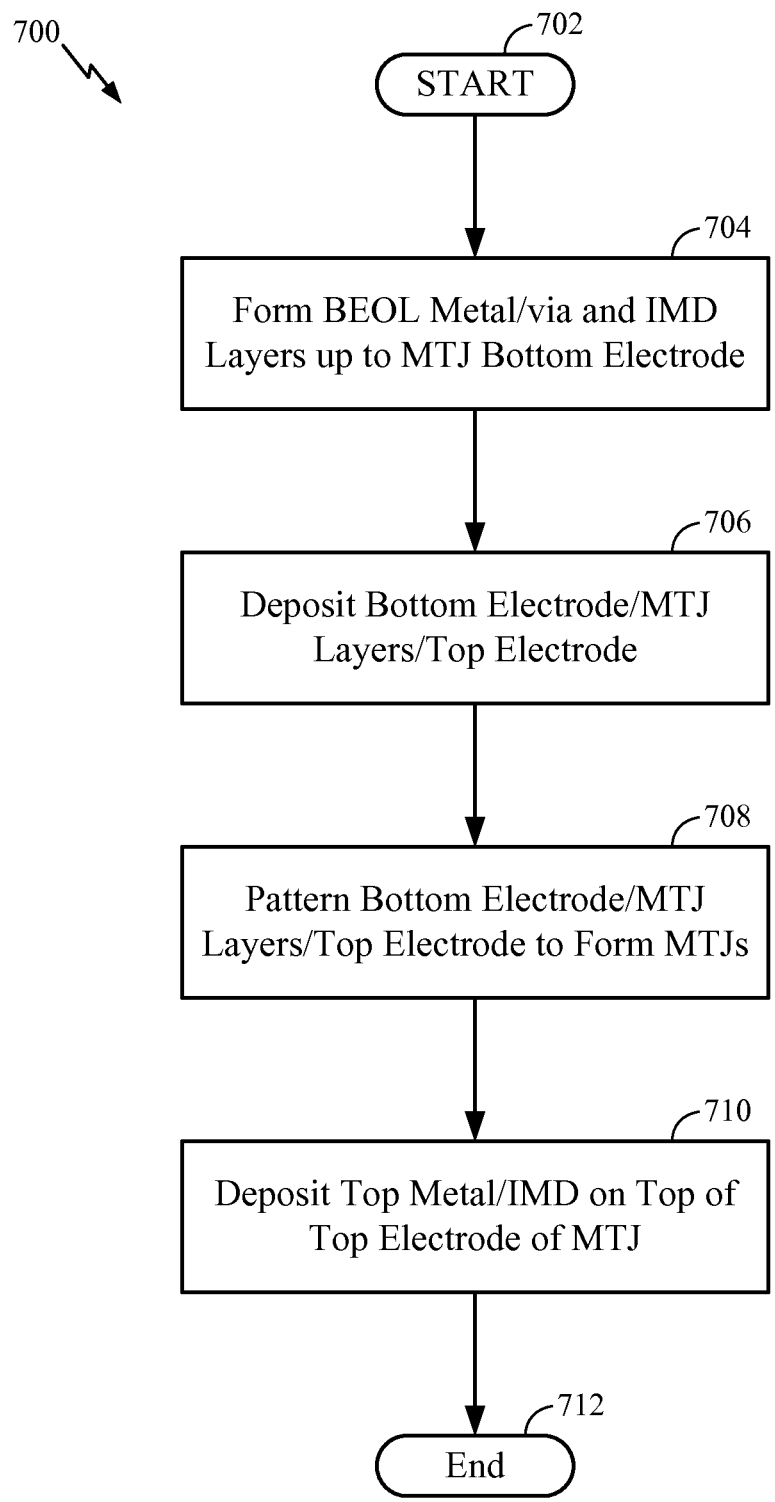
FIG. 7 is a high level flow of example operations in one example process of fabricating structure of one example shared bit line/compressed pitch STT MRAM array.

FIG. 7 shows one flow 700 of example operations in one fabrication process of one device having an SBC/STT MRAM array. In an aspect, operations in the flow 700 may include a starting state 702, for example, a designated region of a dielectric substrate, (e.g., structure supporting the FIG. 1 layer 102), followed by forming, at 704, BEOL metal/via structures and inter-metal dielectric (IMD) layers, up to an MTJ bottom electrode layer. Referring to FIGS. 7 and 3B, operations at 704 may include forming structure up to, but not including MTJ bottom electrode layer (visible in FIG. 3B as immediately above the source lines 308). Referring to FIG. 7, after operations at 704, example operations in the flow 700 can include depositing at 706 MTJ layer structures comprising MTJ bottom electrode layer, MTJ layers, and MTJ top electrode layer. Operations can then, at 708, include patterning the MTJ layer structures deposited at 706 to form MTJ pillars, e.g., the FIG. 3B MTJ pillars 310. Referring to FIG. 7, after the patterning operations at 708, operations in the flow 700 can include, at 710, depositing a top metal/inter-metal dielectric layers having the shared bit lines, e.g., the shared bit lines 302 of FIGS. 3A-3B or the shared bit lines 402 of FIGS. 4A-4B. Operations in the flow 700 can then end at 712.

Figure 8:
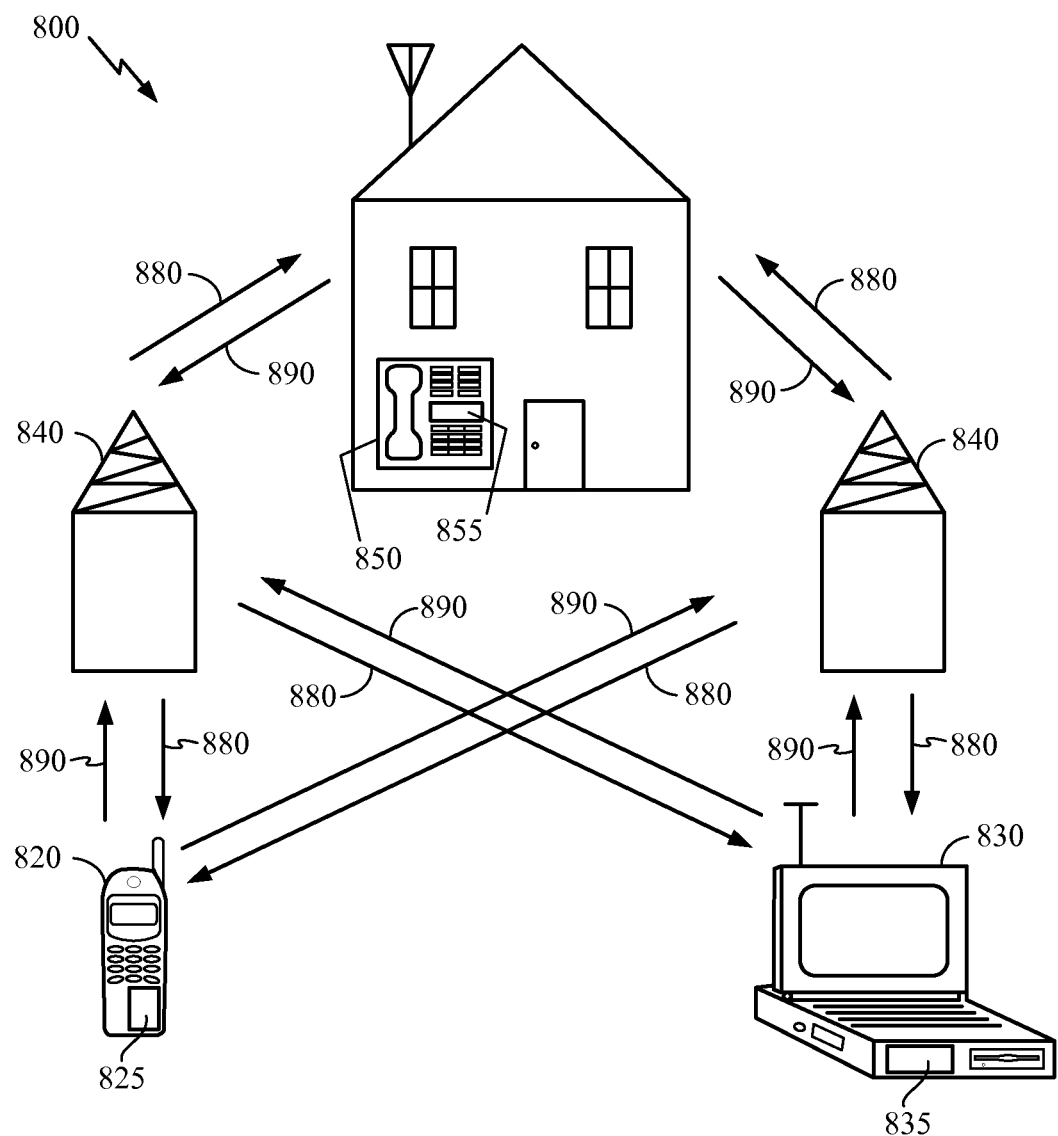
FIG. 8 illustrates one exemplary wireless communication system in which one or more chips or other devices having one or more shared bit line/compressed pitch STT MRAM arrays as described by this disclosure may be advantageously employed.

FIG. 8 illustrates an exemplary wireless communication system 800 in which one or more disclosed aspects may be advantageously employed. For purposes of illustration, FIG. 8 shows three remote units 820, 830, and 850 and two base stations 840. It will be recognized that conventional wireless communication systems may have many more remote units and base stations. The remote units 820, 830, and 850 include integrated circuit or other semiconductor devices 825, 835 and 855, each having at least one semiconductor die that is configured or configurable in accordance with one or more aspects of the invention. FIG. 8 shows forward link signals 880 from the base stations 840 and the remote units 820, 830, and 850 and reverse link signals 890 from the remote units 820, 830, and 850 to the base stations 840.

In FIG. 8, the remote unit 820 is shown as a mobile telephone, the remote unit 830 is shown as a portable computer, and the remote unit 850 is shown as a fixed location remote unit in a wireless local loop system. For example, the remote units may be any one or combination of a mobile phone, hand-held personal communication device (PCS) unit, portable data unit such as a personal digital assistant (PDA), navigation device (such as GPS enabled devices), set top box, music player, video player, entertainment unit, fixed location data unit such as meter reading equipment, or any other device that stores or retrieves data or computer instructions, or any combination thereof. Although FIG. 8 illustrates remote units according to the teachings of the disclosure, the disclosure is not limited to these exemplary illustrated units.

The methods, sequences and/or algorithms described in connection with aspects disclosed herein may be implemented directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of computer-readable storage medium known in the art. An exemplary storage medium is coupled to the processor such that the processor can read information from, and write information to, the storage medium. In one alternative, the storage medium may be integral to the processor.

The foregoing disclosed devices and functionalities may be designed and configured into computer files (e.g., RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above.

While the foregoing disclosure shows illustrative aspects of the invention, it should be noted that various changes and modifications could be made herein without departing from the scope of the invention as defined by the appended claims.

What is claimed is:

1. A spin-transfer torque (STT) magnetic memory, comprising:

a plurality of columns of STT magnetic memory elements, wherein the STT magnetic memory elements comprise a top electrode and a bottom electrode;

a plurality of shared bit lines, overlaying the plurality of columns of STT magnetic memory elements, wherein at least one of the plurality of shared bit lines is coupled to the top electrode of the STT magnetic memory elements of a group of at least two of the plurality of columns of STT magnetic memory elements; and a plurality of source lines, each of the plurality of source lines switchably coupled to the bottom electrode of a STT magnetic memory element of a corresponding one of the plurality of columns of STT magnetic memory elements.

2. The STT magnetic memory of claim 1, wherein the plurality of shared bit lines are configured in an upper metallization layer.

3. The STT magnetic memory of claim 1, wherein the group of at least two of the plurality of columns of STT magnetic memory elements comprises a first group of at least two of the plurality of columns of STT magnetic memory elements, wherein a first shared bit line of the plurality of shared bit lines is coupled to the top electrode of the STT magnetic memory elements of the first group of at least two of the columns of STT magnetic memory elements, and wherein a second shared bit line of the plurality of shared bit lines is coupled to the top electrode of the STT magnetic memory elements of a second group of at least two of the plurality of columns of STT magnetic memory elements.

4. The STT magnetic memory of claim 3, wherein the first group of at least two of the plurality of columns of STT magnetic memory elements comprises at least two adjacent columns of STT magnetic memory elements among the plurality of columns of STT magnetic memory elements, and wherein the second group of at least two of the plurality of columns of STT magnetic memory elements comprises another at least two adjacent columns of STT magnetic memory elements among the plurality of columns of STT magnetic memory elements.

5. The STT magnetic memory of claim 4, wherein the first group of at least two of the plurality of columns of STT magnetic memory elements is adjacent the second group of at least two of the plurality of columns of STT magnetic memory elements.

6. The STT magnetic memory of claim 5, wherein the at least two adjacent columns of STT magnetic memory elements are spaced apart by a center-to-center column pitch, wherein the another at least two adjacent columns of STT magnetic memory elements are spaced apart by said center-to-center column pitch, and wherein the first shared bit line is spaced from the second shared bit line by a shared bit line pitch that is greater than the center-to-center column pitch.

7. The STT magnetic memory of claim 1, wherein each shared bit line of at least a sub-plurality of the plurality of shared bit lines is coupled to the top electrode of the STT magnetic memory elements of a corresponding different group of at least R adjacent columns of STT magnetic memory elements among the plurality of columns of STT magnetic memory elements, wherein R is an integer greater than one.

8. The STT magnetic memory of claim 7, wherein each shared bit line of at least the sub-plurality of the plurality of shared bit lines extends above at least R adjacent ones of the plurality of columns of STT magnetic memory elements.

9. The STT magnetic memory of claim 8, wherein the at least R adjacent ones of the plurality of columns of STT magnetic memory elements, or the another at least R adjacent ones of the plurality of columns of STT magnetic memory elements, or both, are spaced apart by a center-to-center column pitch, wherein at least two of the plurality of shared bit lines extend adjacent to one another and spaced apart by a shared bit line pitch, and wherein the shared bit line pitch is greater than the center-to-center column pitch.

10. The STT magnetic memory of claim 9, wherein R is two, and wherein the center-to-center column pitch is approximately one-half the shared bit line pitch.

11. The STT magnetic memory of claim 9, wherein R is four, and wherein the center-to-center column pitch is approximately one-fourth the shared bit line pitch.

12. The STT magnetic memory of claim 1, wherein the top electrode of the STT magnetic memory elements of at least two adjacent ones of the plurality of columns of STT magnetic memory elements are coupled to a corresponding one of the plurality of shared bit lines.

13. The STT magnetic memory of claim 12, wherein the corresponding one of the plurality of shared bit lines extends above and parallel the at least two adjacent ones of the plurality of columns of STT magnetic memory elements.

14. The STT magnetic memory of claim 12, wherein the corresponding one of the plurality of shared bit lines comprises a metal conductor that extends parallel to and at least partially overlays the at least two adjacent columns of STT magnetic memory elements.

15. The STT magnetic memory of claim 1, wherein a first shared bit line of the plurality of shared bit lines is coupled to the top electrode of the STT magnetic memory elements of a first group of at least four adjacent columns of STT magnetic memory elements, and wherein a second shared bit line of the plurality of shared bit lines is coupled to the top electrode of the STT magnetic memory elements of a second group of at least four adjacent columns of STT magnetic memory elements.

16. The STT magnetic memory of claim 1, wherein the plurality of columns of STT magnetic memory elements, the plurality of shared bit lines, and the plurality of source lines are integrated in at least one semiconductor die.

17. The STT magnetic memory of claim 1, further comprising a device, selected from the group consisting of a set top box, music player, video player, entertainment unit, navigation device, communication device, personal digital assistant (PDA), fixed location data unit, and a computer, into which the plurality of columns of STT magnetic memory elements, the plurality of shared bit lines, and the plurality of source lines are integrated.

18. A method for individually accessing a Spin Transfer Torque (STT) magnetic memory element among a plurality of STT magnetic memory elements coupled to a shared bit line, comprising:

concurrently coupling, to an access voltage, a top electrode of each of a plurality of STT magnetic memory elements in a first column of STT magnetic memory elements and a top electrode of each of a plurality of STT magnetic memory elements in a second column of STT magnetic memory elements; and selectively coupling, to a complementary access voltage, a bottom electrode of a selected STT magnetic memory element in the first column of STT magnetic memory elements and a bottom electrode of a selected STT magnetic memory element in the second column of STT magnetic memory elements.

19. The method of claim 18, wherein concurrently coupling, to the access voltage, the top electrode of each of the plurality of STT magnetic memory elements in the first column of STT magnetic memory elements and the top electrode of each of the plurality of STT magnetic memory elements in the second column of STT magnetic memory elements comprises applying the access voltage to a shared bit line concurrently coupled to the top electrode of each of the plurality of STT magnetic memory elements in the first column of STT magnetic memory elements and the top electrode of each of the plurality of STT magnetic memory elements in the second column of STT magnetic memory elements.

20. The method of claim 19, wherein selectively coupling, to the complementary access voltage, the bottom electrode of the selected STT magnetic memory element in the first column of STT magnetic memory elements and the bottom electrode of the selected STT magnetic memory element in the second column of STT magnetic memory elements comprises:
  coupling the bottom electrode of the STT magnetic memory element in the first column of STT magnetic memory elements to a first source line;
  coupling the bottom electrode of the STT magnetic memory element in the second column of STT magnetic memory elements to a second source line; and
  selecting among the first source line and the second source line as an enabled source line, and coupling the enabled source line to the complementary access voltage.

21. An apparatus for individually accessing a Spin Transfer Torque (STT) magnetic memory element among at least two adjacent columns of STT magnetic memory elements, comprising:
  means for concurrently coupling, to an access voltage, a top electrode of each of a plurality of STT magnetic memory elements in a first column of the at least two adjacent columns of STT magnetic memory elements and a second column of the at least two adjacent columns of STT magnetic memory elements; and
  means for selectively coupling, to a complementary access voltage, a bottom electrode of a selected STT magnetic memory element in the first column of the at least two adjacent columns of STT magnetic memory elements and a bottom electrode of a selected STT magnetic memory element in the second column of the at least two adjacent columns of STT magnetic memory elements.

22. The apparatus for individually accessing the STT magnetic memory element among at least two adjacent columns of claim 21, wherein the at least two adjacent columns of STT magnetic memory elements are integrated in at least one semiconductor die.

23. The apparatus for individually accessing the STT magnetic memory element among at least two adjacent columns of claim 21, further comprising a device, selected from the group consisting of a set top box, music player, video player, entertainment unit, navigation device, communication device, personal digital assistant (PDA), fixed location data unit, and a computer, into which the at least two adjacent columns of STT magnetic memory elements are integrated.

24. A Spin Transfer Torque (STT) magnetic memory, comprising:
  a group of at least R adjacent columns of STT magnetic memory elements, each of the STT magnetic memory elements comprising a first read/write current terminal and a second read/write current terminal;
  a shared bit line, wherein the shared bit line is coupled to the first read/write current terminal of the STT magnetic memory elements in the group of at least R adjacent columns of STT magnetic memory elements;
  a first source line, coupled through a first plurality of selectively enabled switch transistors, to the second read/write current terminal of each of a respective first plurality of STT magnetic memory elements in a first column of STT magnetic memory elements in the group of at least R adjacent columns of STT magnetic memory elements; and
  a second source line, coupled through a second plurality of selectively enabled switch transistors, to the second read/write current terminal of each of a respective second plurality of STT magnetic memory elements in a second column of STT magnetic memory elements in the group of at least R adjacent columns of STT magnetic memory elements.

25. The STT magnetic memory of claim 24, wherein the shared bit line extends parallel to and at least partially overlays at least two of the at least R adjacent columns of STT magnetic memory elements in the group of at least R adjacent columns of STT magnetic memory elements.

26. The STT magnetic memory of claim 24, wherein the group of at least R adjacent columns of STT magnetic memory elements is a first group of at least R adjacent columns of STT magnetic memory elements, and wherein the shared bit line is a first shared bit line, wherein the STT magnetic memory further comprises:
  a second group of at least R adjacent columns of STT magnetic memory elements;
  a second shared bit line, wherein the second shared bit line is coupled to the respective first read/write current terminal of the STT magnetic memory elements in the second group of at least R adjacent columns of STT magnetic memory elements;
  a third source line, coupled through a third plurality of selectively enabled switch transistors, to the second read/write current terminal of each of a respective third plurality of STT magnetic memory elements in a first column of STT magnetic memory elements in the second group of at least R adjacent columns of STT magnetic memory elements; and
  a fourth source line, coupled through a fourth plurality of selectively enabled switch transistors, to the second read/write current terminal of each of a respective second plurality of STT magnetic memory elements in a second column of STT magnetic memory elements in the second group of at least R adjacent columns of STT magnetic memory elements.

27. The STT magnetic memory of claim 26, wherein R is two.

28. The STT magnetic memory of claim 26, wherein R is four.

29. The STT magnetic memory of claim 24, wherein the group of at least R adjacent columns of STT magnetic memory elements, the shared bit line, the first source line, and the second source line are integrated in at least one semiconductor die.

30. The STT magnetic memory of claim 29, further comprising a device, selected from the group consisting of a set top box, music player, video player, entertainment unit, navigation device, communication device, personal digital assistant (PDA), fixed location data unit, and a computer, into which the group of at least R adjacent columns of STT magnetic memory elements, the shared bit line, the first source line, and the second source line are integrated.

* * * * *